(12) United States Patent
Takahashi

(10) Patent No.: US 7,857,984 B2
(45) Date of Patent: Dec. 28, 2010

(54) PLASMA SURFACE TREATMENT METHOD, QUARTZ MEMBER, PLASMA PROCESSING APPARATUS AND PLASMA PROCESSING METHOD

(75) Inventor: Tetsuro Takahashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 620 days.

(21) Appl. No.: 11/829,600

(22) Filed: Jul. 27, 2007

(65) Prior Publication Data
US 2008/0025899 A1    Jan. 31, 2008

(30) Foreign Application Priority Data
Jul. 28, 2006  (JP) .............................. 2006-205533

(51) Int. Cl.
*B44C 1/22* (2006.01)
*H01L 21/302* (2006.01)

(52) U.S. Cl. .................. 216/67; 427/575; 118/715; 438/710; 216/58

(58) Field of Classification Search ............... 427/575; 216/58, 67; 118/715; 438/710
See application file for complete search history.

(56) References Cited

U.S. PATENT DOCUMENTS 5,242,561 A * 9/1993 Sato .................. 204/192.33
6,250,250 B1 * 6/2001 Maishev et al. ......... 118/723 ER
2004/0033361 A1 * 2/2004 Hamaguchi ................ 428/408
2004/0102053 A1 * 5/2004 Kitagawa et al. ........... 438/769
2004/0221809 A1   11/2004 Ohmi et al.
2005/0205013 A1    9/2005 Nakanishi et al.
2006/0275710 A1 * 12/2006 Yamazaki et al. .......... 430/313

FOREIGN PATENT DOCUMENTS

| JP | 2000-294550 | 10/2000 |
| KR | 2001-0072001 | 7/2001 |
| KR | 10-2005-0075442 | 7/2005 |

OTHER PUBLICATIONS

English Translation of JP-2000-294550 (Emi et al).*

* cited by examiner

*Primary Examiner*—Shamim Ahmed
(74) *Attorney, Agent, or Firm*—Oblon, Spivak, McClelland, Maier & Neustadt, L.L.P.

(57) ABSTRACT

A plasma surface treatment method for performing a surface treatment on a quartz member used under a plasma-exposed environment by using a plasma having an ion energy greater than about 5.3 eV. The plasma has, near a surface of the quartz member, an electron temperature higher than or equal to about 2 eV. Further, in a plasma processing apparatus for generating a plasma by introducing a microwave into a processing chamber through a planar antenna having a plurality of slots, the surface treatment is carried out for about 30-300 seconds by using a plasma of a processing gas containing Ar gas and $N_2$ gas under conditions of a processing pressure lower than or equal to about 15 Pa and a microwave power higher than or equal to about 0.9 W/cm$^2$, the surface treatment being repeated 25 to 2000 times.

16 Claims, 10 Drawing Sheets

PLASMA SURFACE TREATMENT METHOD, QUARTZ MEMBER, PLASMA PROCESSING APPARATUS AND PLASMA PROCESSING METHOD

FIELD OF THE INVENTION

The present invention relates to a plasma surface treatment method for performing a plasma surface treatment on a quartz member to be used under a plasma-exposed environment, the quartz member treated by the plasma surface treatment method, and a plasma processing apparatus and method using the quartz member.

BACKGROUND OF THE INVENTION

A plasma processing apparatus for performing a film forming process, an etching process or the like by using a plasma has been used in manufacturing various semiconductor devices made of, e.g., silicon or compound semiconductors, an FPD (flat panel display) such as an LCD (liquid crystal display), and the like. In such a plasma processing apparatus, a member made of a dielectric material such as quartz or the like is widely used as a chamber component part constituting a plasma generation space. For example, in a microwave-excited plasma processing apparatus for generating a plasma by introducing a microwave into a processing chamber by a planar antenna having a plurality of slots, the microwave propagated through a waveguide is introduced into the chamber via the planar antenna and a microwave transmitting plate made of quartz and then reacts with a processing gas, thereby generating a high-density plasma (see, e.g., Japanese Patent Laid-open Application No. 2000-294550 (FIG. 3 for example)).

Meanwhile, in the manufacture of various semiconductor devices or products such as an FPD and the like, there is set a influence value for the number of particles allowed for a product management (allowable number of particles). Therefore, reducing the number of particles is important for the improvement of a product yield. However, in a silicon nitride film forming process of nitriding silicon on a surface of a target substrate by using the microwave-excited plasma processing apparatus configured as described above, particles in excess of the influence value are generated if the number of processed sheets exceeds 1000, for example. And further, as the number of processed sheets increases, the number of particles also increases. The number of particles particularly increases after a long period of idle time (i.e., after the apparatus is not operated for a long time) has elapsed. Further, a particle generation state varies depending on plasma processing conditions. To be specific, particles are apt to be generated when a plasma nitriding process is repeatedly performed under low pressure and high power conditions.

When the plasma nitriding process is repeatedly performed, the number of particles gradually increases and thus a production yield deteriorates as described above. Therefore, the number of particles needs to be reduced below the reference value (allowable number of particles) during the whole processes, and a measure therefor is required.

SUMMARY OF THE INVENTION

Therefore, the present invention provides a plasma processing method and apparatus capable of improving a production yield by suppressing a generation of particles even when repeatedly performing plasma treatments on a plurality of target substrates.

In accordance with a first aspect of the invention, there is provided a plasma surface treatment method for performing a surface treatment on a quartz member used under a plasma-exposed environment by using a plasma having an ion energy greater than about 5.3 eV.

Preferably, the plasma has, near a surface of the quartz member, an electron temperature higher than or equal to about 2 eV.

Preferably, in a plasma processing apparatus for generating a plasma by introducing a microwave into a processing chamber through a planar antenna having a plurality of slots, the surface treatment is carried out for about 30-300 seconds by using a plasma of a processing gas containing Ar gas and $N_2$ gas under conditions of a processing pressure lower than or equal to about 15 Pa and a microwave power higher than or equal to about 0.9 $W/cm^2$, the surface treatment being repeated 25 to 2000 times.

In accordance with a second aspect of the invention, there is provided a quartz member subjected to the aforementioned plasma surface treatment method.

Preferably, the quartz member is a microwave transmitting plate for allowing the microwave to be transmitted there through and supplied to a plasma generation space in a plasma processing apparatus for generating a plasma by introducing a microwave into a processing chamber by a planar antenna having a plurality of slots, the microwave transmitting plate constituting a ceiling wall of the processing chamber.

In accordance with a third aspect of the invention, there is provided a plasma processing apparatus including: an evacuable processing chamber for processing a target substrate by using a plasma; a planar antenna having a plurality of slots for introducing a microwave into the processing chamber; and a microwave transmitting plate constituting a ceiling wall of the processing chamber, transmitted the microwave transmitting plate being disposed under the planar antenna and allowing the microwave to be transmitted through and supplied to a plasma generation space, wherein the microwave transmitting plate is a quartz member subjected to the aforementioned plasma surface treatment method.

In accordance with a fourth aspect of the invention, there is provided a plasma processing method including: generating a first plasma having an ion energy greater than about 5.3 eV, by using a plasma processing apparatus for generating a plasma by introducing a microwave into a processing chamber by a planar antenna having a plurality of slots; performing a surface treatment on a component in the processing chamber by using the first plasma; and performing a plasma processing on a target substrate loaded into the processing chamber by using a second plasma.

Preferably, the first plasma used in the surface treatment process has, near the component, an electron temperature higher than or equal to about 2 eV. Further, it is preferable that the surface treatment process is carried out for 30-300 seconds by using a processing gas containing Ar gas and $N_2$ gas under conditions of a processing pressure lower than or equal to about 15 Pa and a microwave power higher than or equal to about 0.9 $W/cm^2$, the surface treatment being repeated 25 to 2000 times.

Furthermore, it is preferable that the second plasma used in the substrate processing step has an ion energy lower than about 5.3 eV inside the processing chamber.

Preferably, the second plasma has an electron temperature lower than or equal to about 1.5 eV.

Moreover, it is preferable that the substrate processing process is a plasma nitriding process, a plasma oxidation process or a plasma oxynitriding process.

In accordance with a fifth aspect of the invention, there is provided a computer-executable program for controlling, when executed, the plasma processing apparatus to perform the aforementioned plasma surface treatment method.

In accordance with a sixth aspect of the invention, there is provided a computer readable storage medium for storing therein a computer-executable control program, wherein when executed, the control program controls the plasma processing apparatus to perform the aforementioned plasma surface treatment method.

In accordance with a seventh aspect of the invention, there is provided a plasma processing apparatus including: an evacuable processing chamber for processing a target substrate by using a plasma; a planar antenna having a plurality of slots for introducing a microwave into the processing chamber; and a controller for controlling the plasma surface treatment method described above to be performed in the processing chamber.

In accordance with the present invention, the surface treatment is performed on a quartz member to be employed under a plasma-exposed environment by using a plasma having an ion energy greater than about 5.3 eV. Accordingly, the generation of particles can be effectively suppressed when performing the plasma nitriding process by employing the quartz member as an chamber component part.

By performing the plasma surface treatment on the quartz member in the chamber prior to the plasma nitriding process, the plasma nitriding process can be repeatedly carried out while suppressing the particle generation. Accordingly, in case a silicon nitride film generated by the plasma nitriding process is used as, e.g., a gate insulating film, it is possible to provide a highly reliable semiconductor device.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

Figure 1:
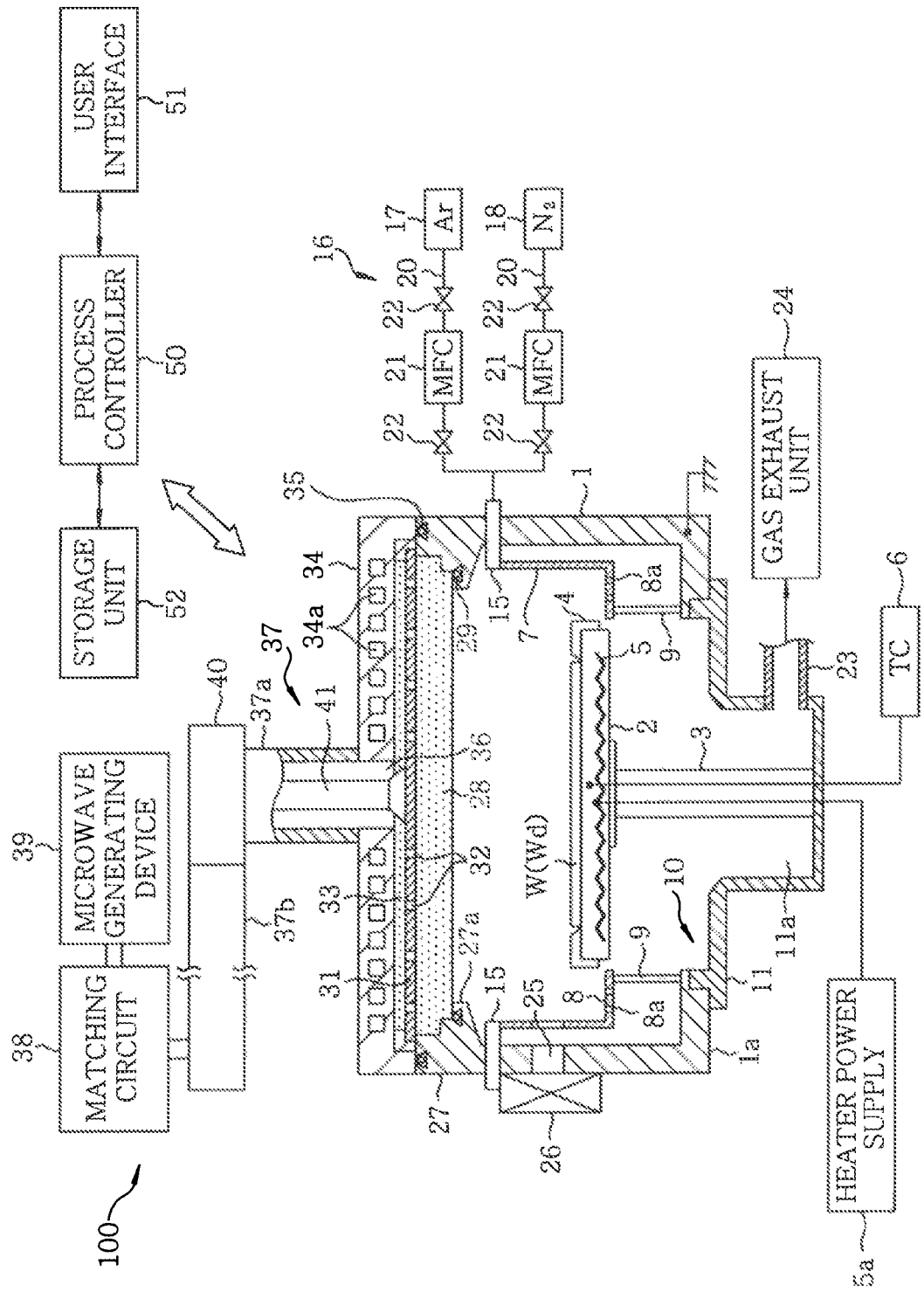
FIG. 1 shows a schematic cross sectional view of an example of a plasma processing apparatus suitable for performing a plasma processing method of the present invention.

Hereinafter, embodiments of the present invention will be described in detail with reference to the accompanying drawings. FIG. 1 is a schematic cross sectional view of an example of a plasma processing apparatus suitable for performing a method of the present invention. The plasma processing apparatus 100 is configured as an RLSA (radial line slot antenna) microwave plasma processing apparatus capable of generating a microwave-excited plasma having a high density and a low electron temperature by introducing a microwave into a processing chamber using a planar antenna having a plurality of slots, especially an RLSA. The plasma processing apparatus 100 can perform a treatment using a plasma having a density of about $1 \times 10^{10}$-$5 \times 10^{12}$/cm$^3$ and a low electron temperature of about 0.7-2 eV. Therefore, such a plasma processing apparatus 100 can be appropriately used for forming a silicon nitride film by nitriding silicon in a manufacturing process of various semiconductor devices.

The plasma processing apparatus 100 includes a substantially cylindrical airtight chamber 1 that is grounded. The chamber 1 may have a square column shape. A circular opening 10 is formed at a substantially central portion on a bottom wall 1a of the chamber 1. A gas exhaust chamber 11 extends downward from the bottom wall 1a and communicates with the opening 10. The gas exhaust chamber 11 is connected with a gas exhaust unit 24 via a gas exhaust line 23.

Provided inside the chamber 1 is a mounting table 2 made of highly thermally conductive ceramic such as AlN or the like, for horizontally supporting a target object, e.g., a silicon wafer (hereinafter, simply referred to as "wafer") The mounting table 2 is supported by a cylindrical supporting member 3 extending upward from a center of a bottom portion of the gas exhaust chamber 11, the supporting member 3 being made of ceramic such as AlN or the like. Provided at the mounting table 2 is a cover ring 4 for guiding the wafer W by covering an outer peripheral portion of the mounting table 2. The cover ring 4 is a member made of, e.g., quartz, AlN, Al$_2$O$_3$, SiN or the like.

A resistance heater 5 is buried in the mounting table 2. Since the resistance heater 5 heats the mounting table by using an electric power supplied from a heater power supply 5a, the wafer W serving as a target substrate is uniformly heated. Further, the mounting table 2 is provided with a thermocouple 6, to thereby control a heating temperature of the wafer W between room temperature and about 900° C., for example. Wafer supporting pins (not shown) for supporting and vertically moving the wafer W are provided at the mounting table 2 so that they can be protruded from and retracted into a surface of the mounting table 2.

Provided along an inner peripheral portion of the chamber 1 is a cylindrical quartz liner 7 for preventing a metal contamination from materials forming the chamber. Further, provided along an outer peripheral portion of the mounting table 2 is a annular shaped baffle plate 8 having a plurality of through holes 8a for uniformly evacuating the inside of the chamber 1. The baffle plate 8 is supported by a plurality of support column 9.

A annular shaped gas inlet part 15 is provided at a sidewall of the chamber 1, and a gas supply system 16 is connected with the gas inlet part 15. The gas inlet part may be arranged in a nozzle shape or a shower shape. The gas supply system 16 has, e.g., an Ar gas supply source 17 and an $N_2$ gas supply source 18. Ar gas and $N_2$ gas reach the gas inlet part 15 via respective gas lines 20 and then are introduced through the gas inlet part 15 into the chamber 1. Each of the gas lines 20 has a mass flow controller (MFC) 21 and opening/closing valves 22 provided at upstream and downstream sides of the mass flow controller 21. Moreover, it is also possible to use a rare gas such as Kr gas, Xe gas, He gas or the like, instead of Ar gas.

The gas exhaust line 23 is connected with a side surface of the gas exhaust chamber 11, and the gas exhaust unit 24 having a high speed vacuum pump is connected with the gas exhaust line 23. By operating the gas exhaust unit 24, the gas inside the chamber 1 is uniformly discharged into a space 11a of the gas exhaust chamber 11 via the baffle plate 8 and then discharged to the outside via the gas exhaust line 23. As a consequence, the inside of the chamber 1 can be rapidly depressurized to a specific vacuum level, e.g., about 0.133 Pa.

Formed on the sidewall of the chamber 1 are a loading/unloading port 25 for loading and unloading the wafer W with respect to a transfer chamber (not shown) dispersed adjacent to the plasma processing chamber 100 and a gate valve 26 for opening and closing the loading/unloading port 25.

An upper portion of the chamber 1 is formed as an opening, and a annular shaped upper plate 27 is coupled with the opening. A lower inner peripheral portion of the upper plate 27 is protruded toward an inner space of the chamber, thereby forming a annular shaped support 27a. Further, a microwave transmitting plate 28 for transmitting a microwave is airtightly provided on the support 27a via a seal member 29, the microwave transmitting plate 28 being made of a dielectric material, e.g., quartz and ceramic such as $Al_2O_3$, AlN or the like. Accordingly, the inside of the chamber 1 is airtightly sealed.

A disc-shaped planar antenna member 31 is provided on the microwave transmitting plate 28 opposite to the mounting table 2. The planar antenna member may have a quadrilateral plate shape, for example, without being limited to the disc shape. The planar antenna member 31 is held by an upper portion of the sidewall of the chamber 1. The planar antenna member 31 is made of a copper or aluminum plate whose surface is coated with gold or silver. Further, a plurality of microwave radiation slots 32 for radiating a microwave are formed to penetrate through the planar antenna member 31 in a specific pattern.

Figure 2:
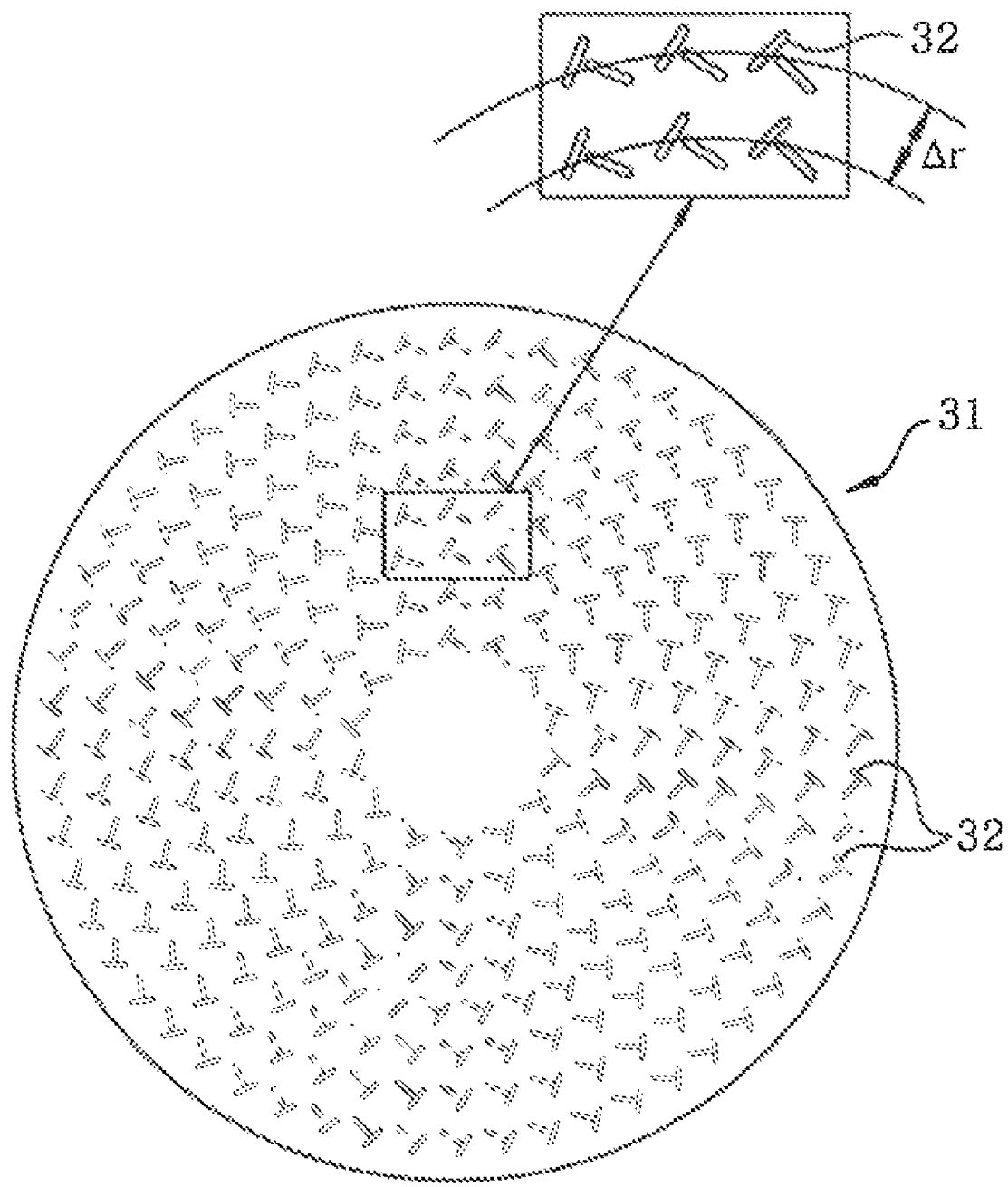
FIG. 2 describes a structure of a planar antenna member.

As shown in FIG. 2, each of the microwave radiation slots 32 has an elongated shape. Typically, each pair of the micro radiation slots 32 is arranged in a T shape, and plural pairs of the microwave radiation slots 32 are arranged in concentric circular lines. A length of the microwave radiation slots 32 and an arrangement distance between the microwave radiation slots 32 are determined based on a wavelength λg of a microwave. For example, the microwave radiation slots 32 are arranged to be spaced apart from each other at an interval of λg/4, λg/2 or λg. Referring to FIG. 2, a distance between two adjacent slots of the microwave radiation slots 32 concentrically arranged is indicated by Δr. The microwave radiation slots 32 may have a circular shape, an arc shape or the like. Moreover, the microwave radiation slots 32 may be arranged in a spiral pattern, radial pattern or the like, for example, other than the concentric circular shapes.

A wave retardation member 33 having a dielectric constant higher than that of vacuum is provided on a top surface of the planar antenna member 31. Since the wavelength of the microwave is lengthened in the vacuum, the wave retardation member 33 serves to shorten the wavelength of the microwave, to thereby control the plasma. Although there may or may not exist a gap between the planar antenna member 31 and the microwave transmitting plate 28 and between the wave retardation member 33 and the planar antenna member 31, it is preferable that there is no gap therebetween.

Provided on the upper part of the chamber 1 is a shield lid 34 for covering the planar antenna member 31 and the wave retardation member 33, the shield lid 34 being made of a metal material, e.g., aluminum, stainless steel or the like. The top surface of the chamber 1 and the shield lid 34 are sealed by a seal member 35. A waveguide is formed by the shield lid 34 and the planar antenna member 31, so that the microwave is propagated radially. Further, a cooling water path 34a is formed in the shield lid 34, and by circulating cooling water therethrough, the shield lid 34, the wave retardation member 33, the planar antenna member 31 and the microwave transmitting plate 28 are cooled. Furthermore, the shield lid 34 and the planar antenna member 31 are grounded.

An opening 36 is formed in a central portion of an upper wall of the shield lid 34, and a waveguide 37 is connected with the opening. A microwave generating device 39 for generating a microwave is connected with an end portion of the waveguide 37 via a matching circuit 38. Accordingly, a microwave having a frequency of, e.g., about 2.45 GHz, which is generated by the microwave generating device 39, is propagated to the planar antenna member 31 through the waveguide 37. As for a frequency of the microwave, 8.35 GHz, 1.98 GHz or the like may also be employed.

The waveguide 37 includes a coaxial waveguide 37a having a circular cross section and extending upward from the opening 36 of the shield lid 34; and a horizontally extending rectangular waveguide 37b connected with an upper portion of the coaxial waveguide 37a via a mode transducer 40. Due to the mode transducer 40 disposed between the rectangular waveguide 37b and the coaxial waveguide 37a, a microwave propagated in a TE mode through the rectangular waveguide 27b is converted in to microwave of a TEM mode. An internal conductor 41 extends in the coaxial waveguide 37a and is fixedly connected at its lower end with the center of the planar antenna member 31. Accordingly, the microwave is effectively and uniformly propagated to the planar antenna member 31 radially through the internal conductor of the coaxial waveguide 37a.

Each component of the plasma processing apparatus 100 is connected with a process controller 50 having a CPU and controlled thereby. The process controller 50 is connected with a user interface 51 having a keyboard, a display and the like. A process operator uses the keyboard when inputting commands for managing the plasma processing apparatus 100, and the display is used to display the operation status of the plasma processing apparatus 100.

Also, the process controller 50 is connected with a storage unit 52 for storing therein recipes including control programs (software) for implementing various processes in the plasma processing apparatus 100 under the control of the process controller 50, processing condition data and the like.

If necessary, the process controller 50 executes a recipe read from the storage unit 52 in response to instructions from the user interface 51 or the like, so that a required process is performed in the plasma processing apparatus 100 under the control of the process controller 50. Further, the recipes such as the control program, the processing condition data and the like can be read from a computer-readable storage medium, e.g., a CD-ROM, a hard disk, a flexible disk, a flash memory, DVD, Blu-ray Disc or the like, or transmitted on-line from another device via, e.g., a dedicated line, when necessary.

The plasma processing apparatus 100 configured as described above can perform a damage free plasma treatment on a base film or the like at a low temperature lower than or equal to about 800° C. and also can realize a uniform processing with a plasma of high uniformity.

The RLSA type plasma processing apparatus 100 configured as described above can perform a process for forming a silicon oxynitride film by nitriding a silicon oxide film of a wafer W in accordance with the following sequences.

First of all, the wafer W is loaded from the loading/unloading port 25 into the chamber 1 by opening the gate valve 26 and then mounted on the mounting table 2. Next, Ar gas and $N_2$ gas are respectively introduced at specific flow rates from the Ar gas supply source 17 and the $N_2$ gas supply source 18 into the chamber 1 through the gas inlet part 15.

Thereafter, the microwave from the microwave generation device 39 is conducted to the waveguide 37 via the matching circuit 38 and then allowed to penetrate the rectangular waveguide 37b, the mode transducer 40 and the coaxial waveguide 37a in that order. Next, the microwave is supplied to the planar antenna member 31 via the internal conductor 41 and is then emitted to a space above the wafer W in the chamber 1 through the slots (microwave transmitting plate 28) of the planar antenna member 31. The microwave is propagated in the TE mode within the rectangular waveguide 37b. Then, the TE mode of the microwave is converted into the TEM mode by the mode transducer 40, and the converted microwave is propagated toward the planar antenna member 31 through the coaxial waveguide 37a.

Due to the microwave emitted from the planar antenna member 31 to the inner space of the chamber 1 through the microwave transmitting plate 28, an electromagnetic field is generated in the chamber 1, to thereby turn Ar gas and $N_2$ gas into a plasma. Specifically, the emission of the microwave through the plurality of microwave radiation slots 32 of the planar antenna member 31 causes the microwave plasma to have a high density of about $1\times10^{10}$-$5\times10^{12}$/cm$^3$, and also to have a low electron temperature lower than or equal to about 1.5 eV near the wafer W. The microwave plasma thus generated inflicts less damage by ions or the like on the base film. Moreover, nitrogen N is introduced into the silicon oxide film by a reaction of active species in the plasma, especially by a reaction of nitrogen radicals N* or the like, thereby forming a silicon oxynitride film (SiON film).

As for a plasma used in the plasma nitriding process for the wafer, it is preferable to use a plasma having an ion energy lower than about 5.3 eV, and it is more preferable to use a plasma having an ion energy lower than or equal to about 4 eV, e.g., about 3 eV to about 4 eV. Further, it is preferable that the plasma used in the nitriding process has an electron temperature lower than or equal to about 1.5 eV, and it is more preferable that the electron temperature ranges between about 0.5 eV about 1 eV. The following is a specific description of plasma generation conditions. A rare gas such as Ar gas or the like is supplied into the chamber 1 at a flow rate of about 0-3000 mL/min (sccm), preferably, about 500-2000 mL/min (sccm). Moreover, $N_2$ gas is supplied into the chamber 1 at a flow rate between about 1-500 mL/min (sccm), preferably, about 10-200 mL/min (sccm). Furthermore, the processing pressure inside the chamber is controlled to be in a range of about 5-366 Pa, preferably, about 5-133.3 Pa. The mounting table 2 is heated to a set temperature of about 200° C. to about 500° C. At this time, a microwave output is set to be about 0.3-2.4 W/cm$^2$ (500-4000 W), preferably 0.3-1.2 W/cm$^2$ (500-2000 W).

After the plasma nitriding process is completed, the supply of the microwave is stopped and, then, the gas supply is also stopped. Next, the processed wafer W is unloaded through the loading/unloading port 25 of the chamber 1 by opening the gate valve 26, thus completing the treatment for the single wafer W.

As described above, the plasma processing apparatus 100 is suitable for a nitriding process wherein a silicon oxide film on a surface of a wafer W is nitrided to form a silicon oxynitride film. The silicon oxynitride film can be appropriately used as a gate insulating film of a transistor, for example. Besides, the plasma processing apparatus can also be used in forming a silicon nitride film by directly nitriding silicon.

Figure 3:
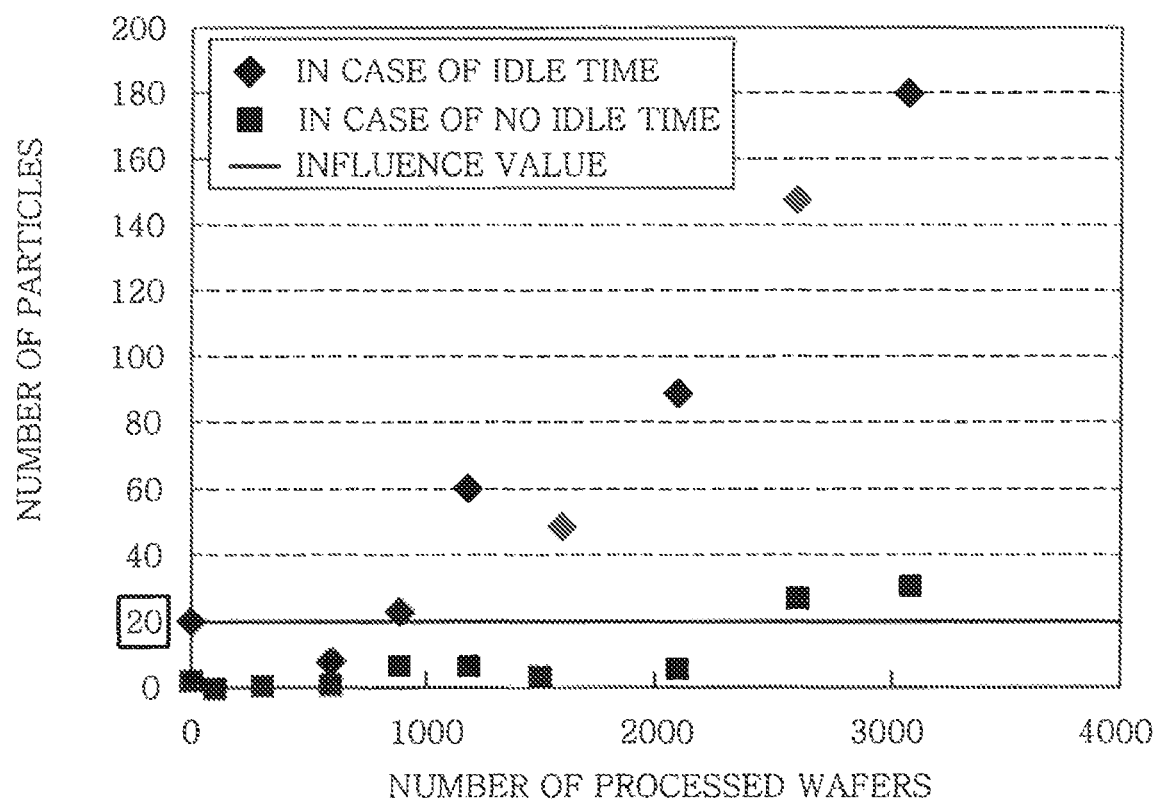
FIG. 3 provides a graph illustrating a relationship between the number of particles and the number of processed wafers in case of performing a plasma nitriding process without performing a plasma surface treatment prior thereto.

Hereinafter, experimental data used to derive the present invention will be explained. Referring to FIG. 3, there are illustrated the accumulated number of processed wafers W (horizontal axis) and the number of particles (vertical axis) measured by a particle measurement device on a surface of a wafer W having a diameter of about 300 mm, in case of performing a nitriding process on a silicon oxide film on the surface of a wafer W with the use of the plasma processing apparatus 100 under following plasma nitriding processing conditions. In this experiment, the number of the particles having a diameter greater than about 0.16 μm was measured.

<Plasma Nitriding Processing Conditions>

| | |
|---|---|
| Ar gas flow rate: | 1000 mL/min (sccm) |
| $N_2$ gas flow rate: | 40 mL/min (sccm) |
| Pressure inside the chamber: | 6.7 Pa (50 mTorr) |
| Processing pressure (temperature of the mounting table 2): | 400° C. |
| Microwave power: | 0.9 W/cm$^2$ (1500 W) |
| Processing time: | 30 seconds |

<Idle Time (if Exists)>

The apparatus was not operated for 10 hours at 400° C. after every 250$^{th}$ plasma nitriding process.

As can be seen from FIG. 3, as the number of processed sheets increases, the number of particles increases and thus exceeds a reference value (allowable number of particles) of, e.g., 20, the number of particles allowed when manufacturing semiconductor devices. Moreover, it was found that in case of providing a long period of idle time, the number of particles abruptly increases substantially when the number of processed wafers W has reached 1000 sheets. Herein, the "idle time" denotes a period of time while the plasma processing apparatus 100 is not operated or vacuum-exhausted while supplying nonreactive gas such as Ar or $N_2$ gas. In addition, although a result is not shown, the amount of generated particles varies depending on the plasma processing conditions. To be specific, it was found that the particles are readily generated when the plasma processing is carried out under low pressure and high power condition for a long period of time.

As a result of researching the particle generation mechanism, it was proved clear that particles are generated mainly from the microwave transmitting plate 28 of the plasma processing apparatus 100. Further, further research thereof indicated that a fragmental layer (damage layer) having a plurality of microcracks exists near a surface of the microwave transmitting plate 28 made of quartz and, thus, particles are generated by a influence of the plasma with the fragmental layer, such as a sputtering by ion, a micro-arc due to a local concentration of an electric field, a dissolution or the like. The reason why the number of particles increases after the idle time has elapsed is supposed that angled portions of the microcracks of the fragmental layer are detached by thermal stress generated during the idle time when a temperature inside the chamber is about 400° C. It is supposed that the fragmental layer causing the generation of particles is formed by microcracks generated when machining a quartz material of the microwave transmitting plate 28 into a specific plate shape and then mechanically polishing a surface thereof. It is preferable that a surface roughness of the quartz is equal to or smaller than 0.2 μm, more preferably equal to or smaller than 0.1 μm.

Therefore, in the plasma processing method of this embodiment, before the wafer W is subjected to the second plasma nitriding process using the plasma processing apparatus 100, chamber component parts, particularly dielectric members, of the plasma processing apparatus 100 are subjected to a surface treatment using a first nitriding plasma having a high ion energy under specific conditions. Such a plasma surface treatment is performed by the plasma processing apparatus 100 under a high energy condition wherein the plasma ion energy is higher than about 5.3 eV, e.g. about 5.4 eV to about 10 eV, preferably, about 5.4 eV to about 6.7 eV. In addition, it is preferable that an electron temperature of the plasma is higher near the surfaces of the chamber component parts, particularly the dielectric members, and it is more preferable that the electron temperature of the plasma is engaged to or higher than about 2 eV, e.g., about 2 eV to about 4 eV.

The following is a description of conditions for forming the plasma having the high ion energy and the high electron temperature by using the plasma processing apparatus of FIG. 1. The processing pressure is lower than or equal to about 15 Pa, e.g., about 0.133 Pa to about 15 Pa, and preferably, the processing pressure is lower than or equal to about 10 Pa, e.g., about 0.133 Pa to about 6.7 Pa. Moreover, the microwave power is higher than or equal to about 0.9 W/cm$^2$ (1500 W), e.g., about 0.9 W/cm$^2$ (1500 W) to about 2.4 W/cm$^2$ (4000 W), preferably higher than or equal to about 1.2 W/cm$^2$ (2000 W), e.g., about 1.2 W/cm$^2$ (2000 W) to about 2.4 W/cm$^2$ (4000 W), and more preferably higher than or equal to about 1.8 W/cm$^2$ (3000 W), e.g., about 1.8 W/cm$^2$ (3000 W) to about 2.4 W/cm$^2$ (4000 W).

As for the processing gas, it is preferable to use a gas system containing a rare gas such as Ar or the like and N$_2$ gas and, especially, it is more preferable to use a gaseous mixture of Ar gas and N$_2$ gas. By using the gaseous mixture of the rare gas, e.g., Ar, and N$_2$ gas, it is possible to reduce the sputtering effect by the plasma and further to suppress the plasma damages inflicted to the chamber component parts. Instead of N$_2$ gas, there can be used, e.g., NH$_3$, MMH (mono-methyl-hydrazin) or the like.

For example, a flow rate of the rare gas, e.g., Ar, ranges between about 0 mL/min (sccm) and about 3000 mL/min (sccm), preferably between about 500 mL/min (sccm) and about 3000 mL/min (sccm), and a flow rate of N$_2$ gas ranges between about 5 mL/min (sccm) and about 500 mL/min (sccm), preferably between about 10 mL/min (sccm) and about 200 mL/min (sccm).

It is preferable that the processing temperature of the plasma surface treatment is high because this reduces the repeated number of the surface treatment. Therefore, the heating temperature of the mounting table 2 is preferably set between about 200° C. and about 800° C. and more preferably between about 400° C. and about 800° C.

In the plasma surface treatment, a single plasma treatment can be performed for about 5-100 seconds and preferably for about 30-300 seconds. Further, it is preferable that the plasma treatment is repeated more than 25 times, e.g., 25 times to 2000 times. More preferably, the plasma treatment is repeated more than 500 times, e.g., 500 times to 2000 times. Most preferably, the plasma treatment is repeated more than 1000 times, e.g., 1000 times to 2000 times.

Figure 4:
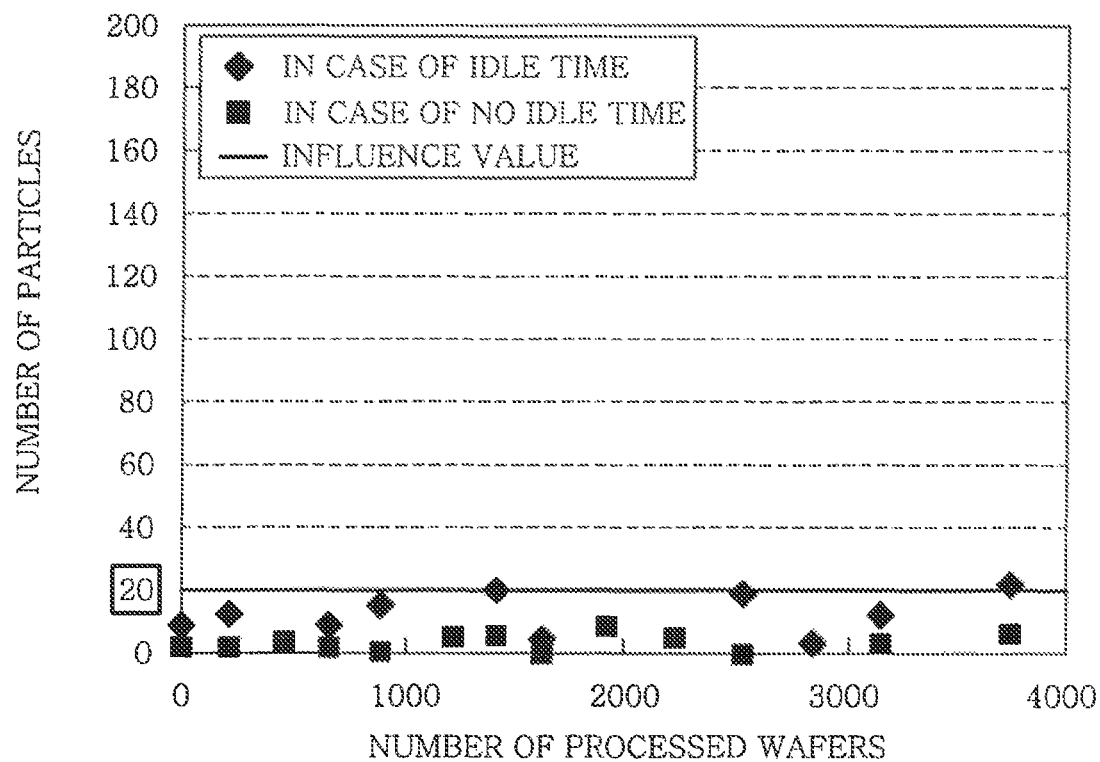
FIG. 4 presents a graph illustrating a relationship between the number of particles and the number of processed sheets in case of performing the plasma nitriding process after the plasma surface treatment.

By performing the plasma surface treatment under the aforementioned conditions, it is possible to effectively remove the fragmental layer existing near the surface of the microwave transmitting plate 28 made of quartz. FIG. 4 shows a plasma generation state obtained by performing the plasma nitriding process after the plasma surface treatment by using the plasma processing apparatus of FIG. 1. At this time, the number of particles having a diameter greater than about 0.16 μm was measured. Further, the plasma surface treatment was performed under the following conditions:
Ar gas flow rate: 1000 mL/min (sccm)
N$_2$ gas flow rate: 40 mL/min (sccm)
processing pressure: 6.7 Pa (50 mTorr)
microwave power: 1.8 W/cm$^2$ (3000 W)
heating temperature of the mounting table 2: 400° C.

A specific sequence of the plasma surface treatment will be described in steps 1 to 5 shown in the following Table 1.

In addition, when the plasma surface treatment is carried out, it is preferable to perform the plasma surface treatment while a dummy wafer Wd is mounted on the mounting table 2 in order to protect the mounting table 2 inside the chamber of the plasma processing apparatus 100.

TABLE 1

|  | Step 1 | Step 2 | Step 3 | Step 4 | Step 5 |
| --- | --- | --- | --- | --- | --- |
| Time (sec) | 20 | 5 | 5 | 210 | 3 |
| Ar gas flow rate (mL/min (sccm)) | 2000 | 2000 | 1000 | 1000 | 1000 |
| N$_2$ gas flow rate (mL/min (sccm)) | 0 | 0 | 0 | 40 | 40 |
| Pressure (Pa) | 126.6 | 126.6 | 6.7 | 6.7 | 6.7 |
| Microwave power (W) | 0 | 2000 | 3000 | 3000 | 0 |

To begin with, in the step 1, a pressure was controlled at about 126.6 Pa while introducing Ar gas into the chamber 1 of the plasma processing apparatus 100 at a flow rate of about 2000 mL/min (sccm) (for 20 seconds). Next, in the step 2, a plasma was generated by introducing a microwave into the chamber 1 while maintaining the flow rate of Ar gas and the pressure (for 5 seconds). In this step, the plasma was set to be easily ignited by controlling the microwave power at about 1.2 W/cm$^2$ (2000 W). Then, in the step 3, the flow rate of Ar gas was reduced to about 1000 mL/min (sccm) corresponding to a set condition of the plasma surface treatment. Further, the pressure was lowered to about 6.7 Pa and, also, the microwave power was increased to about 1.8 W/cm$^2$ (3000 W). In such conditions, the plasma was stabilized (for 5 seconds).

In the step 4, N$_2$ gas was introduced into the chamber 1 at a flow rate of about 40 mL/min (sccm) while maintaining the flow rate of Ar gas, the pressure and the microwave power (for 210 seconds). Moreover, a surface treatment was performed on a component in the chamber 1, especially on the microwave transmitting plate 28, by using the microwave-excited plasma containing nitrogen which has a high ion energy. In the step 5, the plasma surface treatment was completed by stopping the supply of the microwave while maintaining the gas flow rate and the pressure. Next, the gas supply was stopped, and the inside of the chamber 1 was exhausted to vacuum. In this manner, the process of the steps 1 to 5 and the vacuum evacuation were alternately performed 1000 times.

The plasma surface treatment including the aforementioned process may be performed consecutively. However, in that case, the chamber 1 and the components therein, especially the microwave transmitting member 28 and the planar antenna member 31, may be damaged or deformed by heat of the plasma. To that end, it is preferable to perform the plasma surface treatment intermittently. In such a case, the process of the steps 1 to 5 and the vacuum evacuation are performed as one cycle, and a plurality of cycles may be intermittently carried out.

As shown in FIG. 4, even when the accumulated number of processed wafers W exceeds 3000 sheets, the number of particles is limited at or below the reference value of 20 or less (allowable number of particles). By the comparison between FIGS. 3 and 4, it has been found that the plasma surface treatment enables a sharp reduction in the number of particles to be generated by the plasma nitriding process to be performed thereafter.

Figure 5:
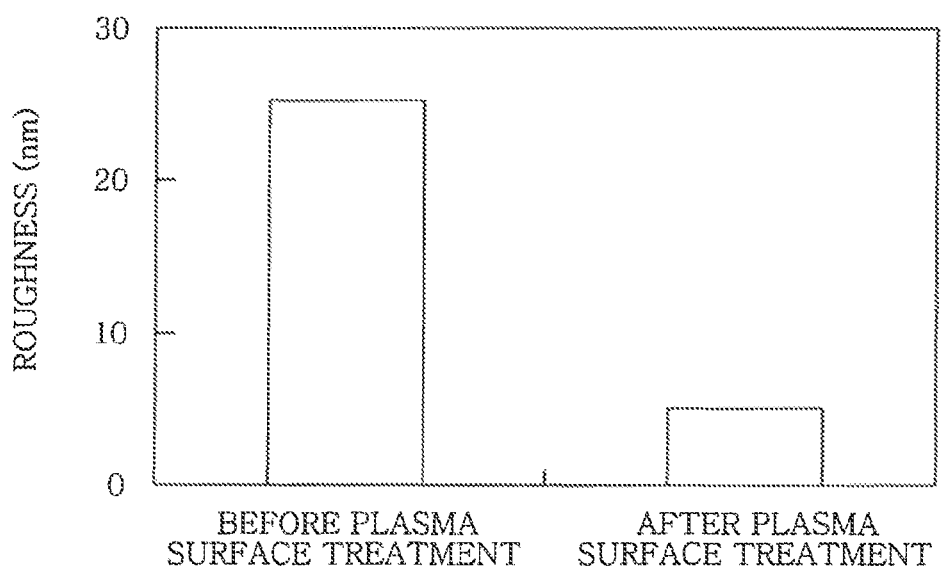
FIG. 5 offers a graph showing a roughness before and after the plasma surface treatment.
Figure 6:
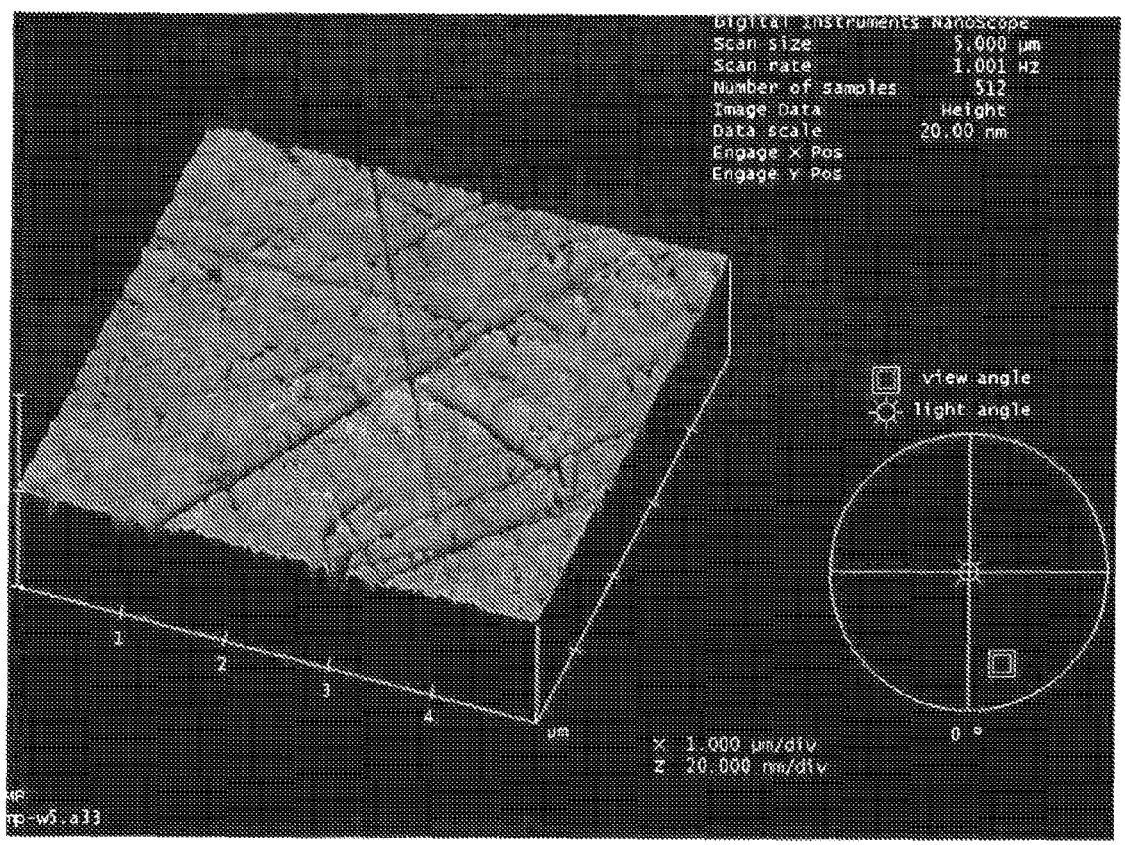
FIG. 6 depicts a surface state of a microwave transmitting plate, which is measured by an AFM (atomic force microscope) before performing the plasma surface treatment.
Figure 7:
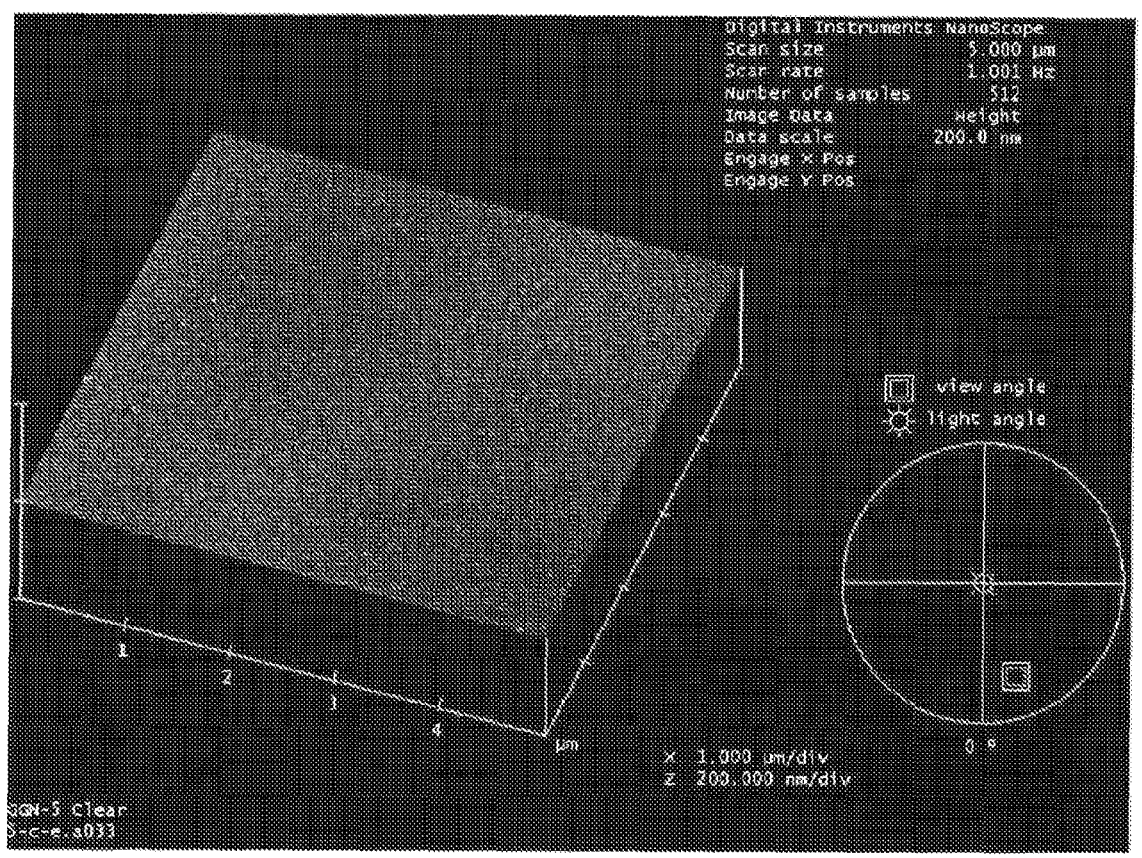
FIG. 7 represents a surface state of a microwave transmitting plate, which is measured by the AFM after performing the plasma surface treatment.

In order to see changes on the surface of the microwave transmitting plate 28 due to the plasma surface treatment, a roughness on the bottom surface of the microwave transmitting plate 28 was measured by an AFM (atomic force microscope) before and after performing the plasma surface treatment. The results thereof are shown in FIGS. 5 to 7. FIG. 6 illustrates a state of the bottom surface of the microwave transmitting plate 28 before performing the plasma surface treatment. Although fine irregularities on the surface are shown in FIG. 6, the irregularities have disappeared in FIG. 7 depicting a state after performing the plasma surface treatment. Therefore, it was confirmed that the surface becomes even because the roughness of the microwave transmitting plate is greatly reduced by performing the plasma surface treatment. In other words, it is believed that the fragmental layer near the surface of the microwave transmitting plate 28 has been reformed or has disappeared by the reaction with the plasma having a high ion energy used in the plasma surface treatment.

In the above-described experiment, it was found that the number of particles generated by the microwave transmitting plate 28 that is one component of the plasma processing apparatus 100 can be reduced by performing the plasma surface treatment. The effects of suppressing the generation of particles can also be obtained by performing the plasma surface treatment individually on a quartz member such as the microwave transmitting plate 28 or the like with the use of a plasma surface treatment apparatus having a configuration same as that of the plasma processing apparatus 100. That is, it is not necessarily required to perform the plasma surface treatment on the quartz member installed in the plasma processing apparatus 100 for use in processing products such as wafers W or the like. The plasma surface treatment can also be performed individually on a target object, i.e., the microwave transmitting plate 28 is not yet installed in the plasma processing apparatus 100, by using a dedicated apparatus for the plasma surface treatment, for example. In that case, the plasma surface treatment can be performed under the conditions same as those of the aforementioned plasma surface treatment. Further, as for a plasma source in the plasma surface treatment apparatus, there can be employed, e.g., a remote plasma source, an ICP plasma source, an ECR plasma source, a surface reflection wave plasma source, a magnetron plasma source or the like. As for conditions of the plasma, the same conditions as those of the aforementioned embodiment can be applied.

Besides, it is possible to repeatedly reuse the quartz member, such as the microwave transmitting plate 28 that has caused the generation of particles by performing the plasma surface treatment thereon, as well as a quartz member that has not used.

In order to determine conditions of the plasma surface treatment, after generating a plasma by the plasma processing apparatus 100 of FIG. 1 the under following conditions, an ion energy thereof was measured.

<Condition 1>

| | |
|---|---|
| Ar gas flow rate: | 1000 mL/min (sccm) |
| $N_2$ gas flow rate: | 40 mL/min (sccm) |
| Processing pressure: | 6.7 Pa (50 mTorr), 10 Pa (75 mTorr) |
| Microwave power: | 0.72 W/cm² (1200 W), 0.9 W/cm² (1500 W), 1.2 W/cm² (2000 W) and 1.8 W/cm² (3000 W) |
| Temperature of the mounting table 2: | room temperature |

<Condition 2>

| | |
|---|---|
| Ar gas flow rate: | 1000 mL/min (sccm) |
| $N_2$ gas flow rate: | 200 mL/min (sccm) |
| Processing pressure: | 12 Pa (90 mTorr) |
| Microwave power: | 0.72 W/cm² (1200 W), 0.9 W/cm² (1500 W), 1.2 W/cm² (2000 W) and 1.8 W/cm² (3000 W) |
| Temperature of the mounting table 2: | room temperature |

Figure 8:
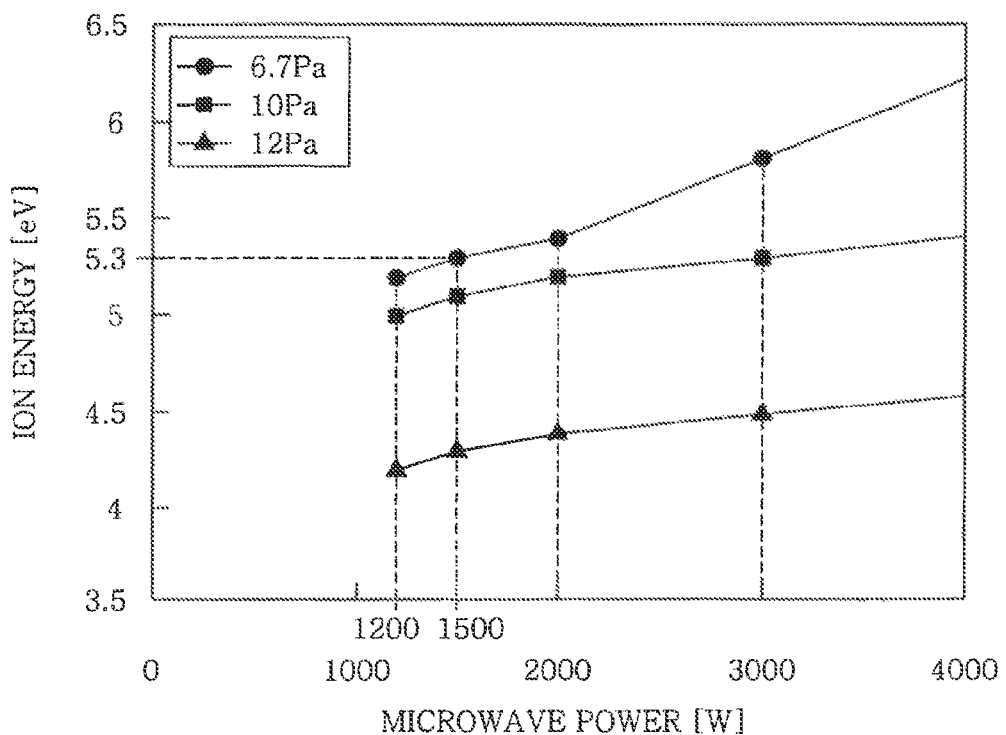
FIG. 8 is a graph plotting, for various pressing pressure, a relationship between a microwave power and an ion energy as a function of processing pressure.

FIG. 8 shows a graph plotting, on the basis of a processing pressure, a relationship between a microwave power (horizontal axis) and a plasma ion energy (vertical axis). Further, FIG. 9 shows a graph plotting, on the basis of a microwave power, a relationship between a pressure (horizontal axis) and a plasma ion energy (vertical axis).

Figure 9:
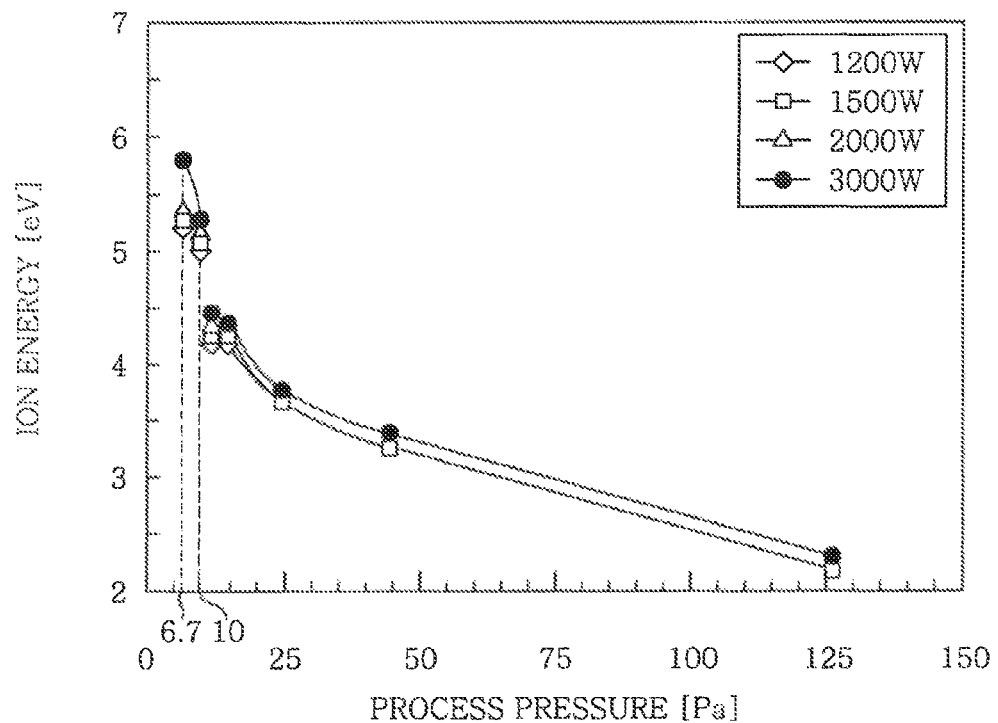
FIG. 9 shows a graph plotting, for various microwave pressure, a relationship between a processing pressure and an ion energy as a function of microwave power.

Referring to FIGS. 8 and 9, it is clear that the plasma ion energy increases as the processing pressure decreases within the set condition range. Within the set condition range, the ion energy tends to increase as the microwave power increases, even though the microwave power is not so influential compared with the processing power. According to the above result, in order to obtain a plasma having a high ion energy greater than about 5.3 eV, for example, required for the plasma surface treatment, the processing pressure is preferably set to be about 10 Pa or less, and more preferably about 6.7 Pa or less. For the same purpose, the microwave power is preferably set to be about 0.9 W/cm² (1500 W) or higher, more preferably about 0.9 W/cm² (2000 W) or higher, and most preferably about 1.5 W/cm² (3000 W) or higher.

Figure 10:
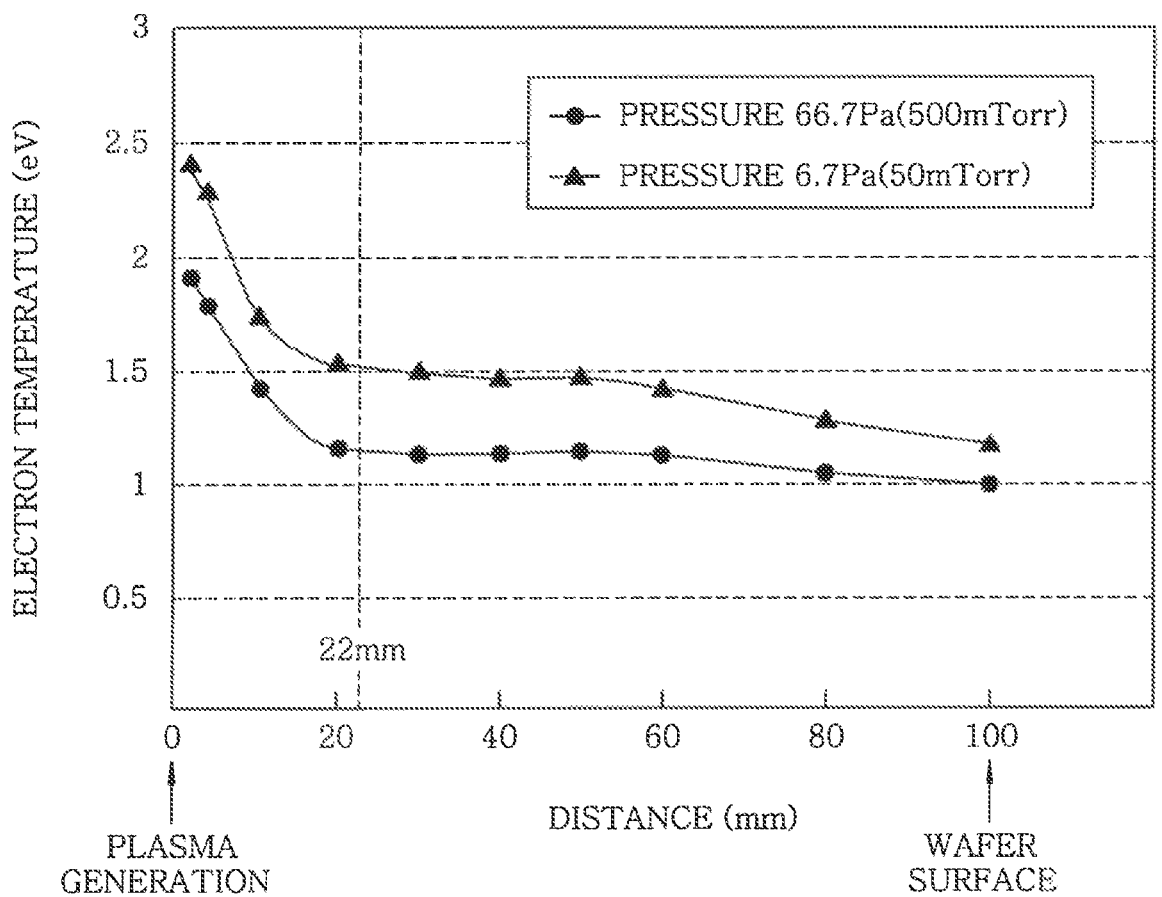
FIG. 10 illustrates a graph depicting a relationship between a distance from a plasma generation unit and an electron temperature.

FIG. 10 illustrates a graph plotting, on the basis of a processing pressure, a relationship between a distance (mm) (horizontal axis) from a lower end of the microwave transmitting plate 28 and a plasma electron temperature (vertical axis). A processing pressure during the plasma treatment was set to be about 6.7 Pa (50 mTorr) or about 66.7 Pa (500 mTorr). As can be seen from FIG. 10, the electron temperature tends to decrease as the distance from the microwave transmitting plate 28 increases. Especially, the electron temperature abruptly decreases until the distance from the lower end of the microwave transmitting plate 28 reaches about 20 mm. However, in case the processing pressure is lower than or equal to about 6.7 Pa, a plasma having an electron temperature higher than or equal to about 1.5 eV and lower than or equal to about 2 eV can be generated directly under the microwave transmitting plate 28. Therefore, near the microwave transmitting plate 28, it is preferable to perform the plasma surface treatment at a high electron temperature higher than or equal to about 2-10 eV, more preferably, between about 2 eV and about 4 eV while controlling the processing pressure to be lower than or equal to about 6.7 Pa.

Figure 11:
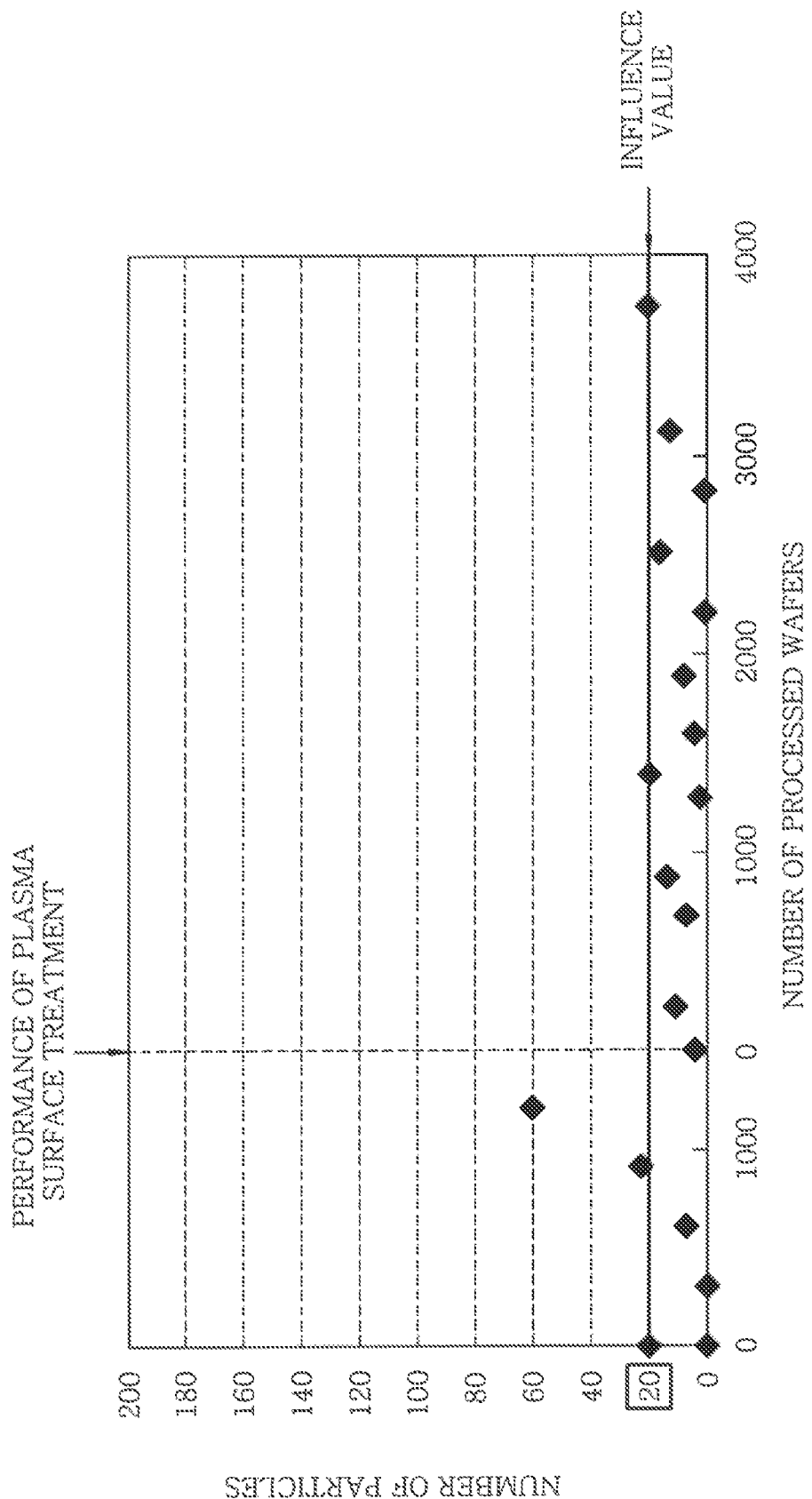
FIG. 11 describes a graph illustrating a change in the number of particles during a running test.

FIG. 11 describes a change in the number of particles during a running test in which the plasma surface treatment is performed in the middle of the plasma nitriding processes repeatedly performed on about 4000 sheets of wafers W. In this test, the number of particles having a diameter greater than about 0.16 μm was measured. Also, the plasma nitriding process and the plasma surface treatment in this test were performed under the following conditions.

<Plasma Nitriding Process Conditions>

| | |
|---|---|
| Ar gas flow rate: | 1000 mL/min (sccm) |
| $N_2$ gas flow rate: | 40 mL/min (sccm) |
| Pressure inside chamber: | 6.7 Pa (50 mTorr) |
| Processing temperature (temperature of the mounting table 2): | 400° C. |
| Microwave power: | 0.9 W/cm$^2$ (1500 W) |
| Processing time: | 30 seconds |

<Plasma Surface Treatment Conditions>

| | |
|---|---|
| Ar gas flow rate: | 1000 mL/min(sccm) |
| $N_2$ gas flow rate: | 40 mL/min(sccm) |
| Pressure inside chamber: | 6.7 Pa(50 mTorr) |
| Processing temperature (temperature of the mounting table 2): | 400° C. |
| Microwave power: | 1.8 W/cm$^2$ (3000 W) |
| Processing time: | 210 seconds |

*The Plasma surface treatment was repeatedly performed 1000 times.

As can be seen from FIG. 11, before the plasma surface treatment is performed, the number of particles increased as the number of processed wafers W increased. Therefore, when the number of processed wafers W reached about 1000 sheets, the number of particles exceeded the reference value (allowable number of particles), i.e., 20. However, by performing the plasma surface treatment inside the chamber 1 of the plasma processing apparatus 100, the number of particles was reduced substantially to a level before the plasma nitriding process and, then, the number of particles was varied not to exceed the influence value (allowable number of particles) until the number of processed wafers reached about 4000 sheets. Therefore, it has been found that by the plasma surface treatment performed in the middle of the plasma nitriding processes, it is possible to reduce the number of particles increased by the repeated plasma nitriding processes to an initial level and also possible to suppress an increase of the number of particles thereafter.

Figure 12:
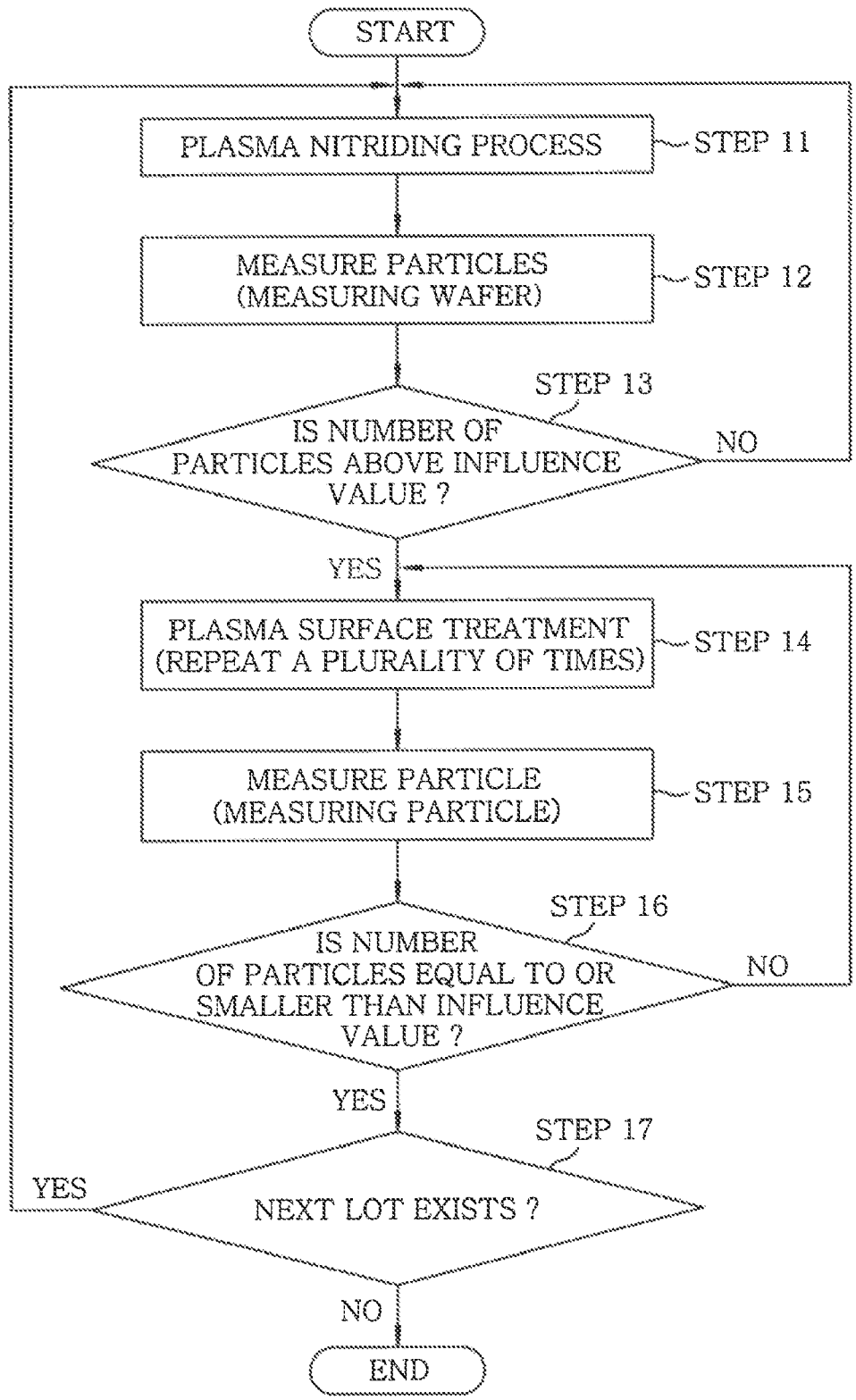
FIG. 12 offers a flowchart showing an exemplary sequence of a plasma processing method.

The following is a description of an embodiment of the plasma treatment of the present invention, the plasma treatment being performed by using the plasma processing apparatus 100 configured as shown in FIG. 1. FIG. 12 offers a flowchart showing a sequence of a plasma processing method in which a plasma surface treatment process is carried out in the middle of plasma nitriding processes based on the measured number of particles. Accordingly, by performing the nitriding process on an area in which the surface of the quartz in the processing chamber by using a strong plasma, it was possible to suppress a generation of the particles even if the wafer is repeatedly processed under conditions that the pressure of the plasma nitriding process is equal to or higher than 20 Pa.

Above all, a plasma nitriding process is performed in the chamber 1 of the plasma processing apparatus 100 in step 11 of FIG. 12. The plasma nitriding process can be carried out in the above-described sequence. For example, a wafer W (product wafer) as a target substrate is loaded into the chamber 1 and then mounted on the mounting table 2. Next, Ar gas and $N_2$ gas are respectively introduced at specific flow rates into the chamber 11 via the gas inlet part 15. Thereafter, a microwave from the microwave generating device 39 is emitted to a space above the wafer W inside the chamber 1 through the microwave transmitting plate 28, thereby generating a plasma. In the plasma nitrification process, nitrogen is introduced into a silicon oxide film ($SiO_2$ film) that has been previously formed on a surface of the wafer W, so that a silicon oxynitride film (SiON film) is formed. The plasma nitriding process is carried out under the conditions same as the aforementioned conditions with respect to the gas flow rates, the pressure, the microwave power, the temperature and the like.

After the plasma nitriding process is completed, the supply of the microwave is stopped and, then, the gas supply is also stopped. Next, the processed wafer W is unloaded through the loading/unloading port 25 of the chamber 1 by opening the gate valve 26, thus completing the treatment for the single wafer W. The plasma nitriding process of the step 11 is repeatedly performed on a plurality of wafers W (e.g., about 10000 sheets in total).

Next, in step 12, the number of particles is measured. To be specific, instead of the wafer W (product wafer) as a target substrate, a measuring wafer Wm is loaded into the chamber 1 and, then, the processing is performed under the conditions same as those in the step 11. Thereafter, the measuring wafer Wm is unloaded from the chamber 1, and the number of particles on the wafer surface is measured by a particle measurement device. The number of particles can be measured every time after a specific number of wafers W (product wafers) are processed.

Thereafter, it is determined in step 13 whether or not the number of particles exceeds a reference value (allowable number of particles, e.g., 2) based on the measurement result in the step 12. If the number of particles exceeds the reference value (YES), in order to suppress the generation of particles, the plasma surface treatment is performed on the inside of the chamber 1 of the plasma processing apparatus 100 having as a component the microwave transmitting plate 28. The plasma surface treatment can be carried out in a state that the microwave transmitting plate 28 is installed inside the chamber 1.

The plasmas surface treatment of the step 14 can be performed according to the sequence of steps 1 to 5 shown in Table 1.

To be specific, a dummy wafer Wd is loaded into the chamber 1 of the plasma processing apparatus 100 and, then, a pressure is controlled while introducing Ar gas thereinto. Next, a microwave is introduced into the chamber 1 while maintaining the flow rate of Ar gas and the pressure, thereby generating a plasma. Thereafter, the plasma is stabilized by setting the flow rate of Ar gas, the pressure and the microwave power to the set conditions of the plasma surface treatment. Then, $N_2$ gas is introduced into the chamber 1 while maintaining the flow rate of Ar gas, the pressure and the microwave power. Next, a surface treatment is performed on a component inside the chamber 1, especially on the microwave transmitting plate 28, by using a microwave-excited plasma containing nitrogen which has a high ion energy. Then, the plasma surface treatment is completed by stopping a supply of the microwave while maintaining the gas flow rate and the pressure. Thereafter, the inside of the chamber 1 is exhausted to vacuum, if necessary. The above-described processes are repeatedly performed.

The plasma nitriding process of the step 14 can be performed under the conditions same as the aforementioned conditions with respect to the gas flow rate, the pressure, the microwave power, the temperature and the like. Further, the plasma treatment is preferably repeated more than 500 times, e.g., 500 times to 2000 times, and more preferably more than 1000 times, e.g., 1000 times to 2000 times.

Meanwhile, if it is determined in the step 13 that the number of particles does not exceed the influence value (NO), the plasma nitriding process of the step 11 is performed on the wafer W (product wafer). In that case, the processes of steps 11 to 13 can be repeatedly carried out until the number of particles exceeds the reference value.

After the plasma surface treatment is performed in the step 14, the number of particles is measured in step 15. The particle measurement in the step 15 can be repeatedly performed whenever the plasma surface treatment has been carried out a specific number of times. To be specific, instead of a dummy wafer Wd, a measuring wafer Wm is loaded into the chamber 1 and, then, the treatment is performed under the conditions same as those in the step 11. Thereafter, the measuring wafer Wm is unloaded from the chamber 1, and the number of particles on the wafer surface is measured by a particle measurement device (not shown).

Next, it is determined in step 16 whether or not the number of particles is smaller than or equal to the influence value (allowable number of particles) based on the measurement result in the step 15. If the number of particles is smaller than or equal to the influence value (YES), since this means that the interior of the chamber 1 is in a clean state, it is confirmed in step 17 whether or not there exists a next lot to be processed. If it is determined in the step 17 that there exists a next lot (YES), the process returns to the step 11 to perform the plasma nitriding process on the wafer W (product wafer) instead of the dummy wafer Wd. On the other hand, if it is determined in the step 17 that there exists no next lot (No), the process is completed.

Meanwhile, if it is determined in the step 16 that the number of particles exceeds the reference value (NO), the plasma surface treatment of the step 14 is carried out. The processes of the steps 14 to 16 can be performed until the number of particles is reduced to the influence value or less.

Although the embodiments of the present invention have been described, the present invention can be variously modified without being limited to those embodiments.

For example, the microwave transmitting plate 28 in the plasma processing apparatus 100 of FIG. 1 is employed as a quartz member in the above-described embodiments. However, another chamber component part such as a quartz liner, a shower plate or the like may also be employed as a quartz member. In such a case as well, the number of particles generated from the quartz member can be reduced by performing the plasma surface treatment on the quartz member.

Although the RLSA type plasma processing apparatus 100 has been described in the above-described embodiments, the present invention can also be applied to another plasma processing apparatus, e.g., a remote plasma processing apparatus, an ICP plasma processing apparatus, an ECR plasma processing apparatus, a surface reflected wave plasma processing apparatus, a magnetron plasma processing apparatus or the like.

While the invention has been shown and described with respect to the embodiments, it will be understood by those skilled in the art that various changes and modification may be made without departing from the scope of the invention as defined in the following claims.

What is claimed is:

1. A plasma surface treatment method for performing a surface treatment on a quartz member used in a processing chamber in which a plasma process is performed on a target substrate, the surface treatment being performed by using a plasma having an ion energy greater than about 5.3 eV,
   wherein the surface treatment is performed when the target substrate is unloaded from the processing chamber.

2. The plasma surface treatment method of claim 1, wherein the plasma has, near a surface of the quartz member, an electron temperature higher than or equal to about 2 eV.

3. The plasma surface treatment method of claim 1, wherein the surface treatment is carried out under condition of a processing pressure lower than or equal to about 15 Pa.

4. A plasma processing method comprising:
   generating a first plasma having an ion energy greater than about 5.3 eV, by using a plasma processing apparatus for generating a plasma by introducing a microwave into a processing chamber by a planar antenna having a plurality of slots;
   performing a surface treatment on a quartz member in the processing chamber by using the first plasma; and
   performing a plasma processing on a target substrate loaded into the processing chamber by using a second plasma,
   wherein the surface treatment is performed when the target substrate is unloaded from the processing chamber.

5. The plasma processing method of claim 4, wherein the first plasma used in the surface treatment process has, near the component, an electron temperature higher than or equal to about 2 eV.

6. The plasma processing method of claim 4, wherein the surface treatment process is carried out by using a processing gas containing Ar gas and $N_2$ gas.

7. The plasma processing method of claim 4, wherein the second plasma used in the substrate processing step has an ion energy lower than about 5.3 eV inside the processing chamber.

8. The plasma processing method of claim 4, wherein the second plasma has an electron temperature lower than or equal to about 1.5 eV.

9. The plasma processing method of claim 4, wherein the substrate processing process is a plasma nitriding process, a plasma oxidation process or a plasma oxynitriding process.

10. The plasma surface treatment method of claim 1, wherein the surface treatment is repeated 25 to 2000 times.

11. The plasma processing method of claim 4, wherein the surface treatment is carried out under condition of a processing pressure lower than or equal to about 15 Pa.

12. The plasma processing method of claim 4, wherein the surface treatment is repeated 25 to 2000 times.

13. A plasma processing method comprising:
   generating a first plasma having an ion energy greater than about 5.3 eV, by using a plasma processing apparatus for generating a plasma by using a plasma source;
   performing a surface treatment on a quartz member in the processing chamber by using the first plasma; and
   performing a plasma processing on a target substrate loaded into the processing chamber using a second plasma, wherein the surface treatment is performed when the target substrate is unloaded from the processing chamber.

14. The plasma processing method of claim 13, wherein the surface treatment is carried out under condition of a processing pressure lower than or equal to about 15 Pa.

15. The plasma processing method of claim 13, wherein the surface treatment is repeated 25 to 2000 times.

16. The plasma processing method of claim 13, wherein the plasma source is selected in the group of a remote plasma source, an ICP plasma source, an ECR plasma source, a surface reflection wave plasma source, and a magnetron plasma source.

* * * * *